United States Patent [19]
Numazaki et al.

[11] Patent Number: 5,889,722
[45] Date of Patent: Mar. 30, 1999

[54] HYBRID INTEGRATED CIRCUIT DEVICE AND METHOD OF FABRICATING THE SAME

[75] Inventors: Koji Numazaki, Nukata-gun; Takahisa Koyasu, Nishio; Hiroyuki Ban, Hazu-gun, all of Japan

[73] Assignee: Denso Corporation, Kariya, Japan

[21] Appl. No.: 917,131

[22] Filed: Aug. 25, 1997

[30] Foreign Application Priority Data

Aug. 27, 1996 [JP] Japan .................................. 8-225540

[51] Int. Cl.$^6$ .................................................. G11C 7/00
[52] U.S. Cl. .................... 365/226; 365/226; 365/189.09; 327/530
[58] Field of Search .............................. 365/226, 189.09; 327/530

[56] References Cited

U.S. PATENT DOCUMENTS

| | | | |
|---|---|---|---|
| 5,287,320 | 2/1994 | Adachi et al. | 365/226 |
| 5,444,664 | 8/1995 | Kuroda et al. | 365/226 |
| 5,572,478 | 11/1996 | Sato et al. | 365/226 |
| 5,694,364 | 12/1997 | Morishita et al. | 365/201 |

FOREIGN PATENT DOCUMENTS

| | | |
|---|---|---|
| U-57-135746 | 2/1956 | Japan . |
| A-62-243356 | 10/1987 | Japan . |

*Primary Examiner*—David Nelms
*Assistant Examiner*—VanThu Nguyen
*Attorney, Agent, or Firm*—Pillsbury Madison & Sutro LLP

[57] ABSTRACT

An IC which integrates an EPROM is disposed on a circuit board. Also, a pad for supplying a writing voltage to the EPROM and a voltage supplying circuit, for supplying a power voltage to power terminals of the IC, which includes a first transistor and a second transistor, are disposed on the circuit board. When the pad is supplied with a high voltage for writing the data in the EPROM, the first transistor is on, the second transistor is off, and the voltage is supplied to the EPROM as the writing voltage. When data are read from the EPROM after the circuit board is packaged, because the pad is not supplied with any voltage, the first transistor is off, the second transistor is on, and a reading voltage is supplied to the EPROM via the outer terminal.

16 Claims, 5 Drawing Sheets

HYBRID INTEGRATED CIRCUIT DEVICE AND METHOD OF FABRICATING THE SAME

CROSS REFERENCE TO RELATED APPLICATION

This application is based on and claims priority of Japanese Patent Application No. Hei. 8-225540 filed on Aug. 27, 1996, the content of which is incorporated herein by reference.

BACKGROUND OF THE INVENTION

1. Field of the Invention

The present invention relates to a hybrid integrated circuit device which includes a memory cell which is capable of having data electrically written therein and a circuit element which writes the data in the memory and reads the data from the memory both disposed on a circuit board.

2. Description of Related Art

FIG. 11 is a circuit diagram illustrating a part of conventional hybrid integrated circuit device. An EPROM 2 has a memory cell, which electrically stores data such as programmed data therein and a circuit element such as an integrated circuit (IC) 3 consisting of circuits including a microcomputer which writes the data in the EPROM 2 and reads the data from the EPROM 2 disposed on a circuit board 1. As shown in FIG. 11, the EPROM 2 is integrated in the IC 3.

When the data are written in the EPROM 2 after hybrid integrated circuits are disposed on the circuit board 1, a high voltage $V_{PP}$ for writing the data (writing voltage) is supplied to the EPROM 2 via an outer terminal B and a power terminal 3a of the IC 3, and also an active voltage $V_{DD}$ is supplied to the IC 3 via an outer terminal A and a power terminal 3b. When the data written in the EPROM 2 are read from the EPROM 2 after the circuit board 1 is packaged, a reading voltage used for reading the data is supplied to the EPROM 2 via the outer terminal B and the power terminal 3a, and also the logic power is supplied to the IC 3 via the outer terminal A and the power terminal 3b. In this case, the reading voltage is the same voltage as the voltage $V_{DD}$ of the IC 3.

Recently, because functions of the hybrid integrated circuit device are improved, the number of outer terminals of the hybrid integrated circuit device have increased. However, if the outer terminals of the hybrid integrated circuit device increase, the area of the circuit board also increases, thus, the number of outer terminals of the hybrid integrated circuit must be decreased in order to reduce the area of the circuit board.

Because the writing voltage must be higher than the reading voltage and the voltage $V_{DD}$, as shown in FIG. 11, the outer terminal B is necessary to supply the writing voltage to the EPROM 2. In this case, if the data are written in the EPROM 2 before the hybrid integrated circuits are disposed on the circuit board 1, and the reading voltage is supplied to EPROM 2 from a power source area other than the outer terminal B, for instance, the reading voltage is supplied to the EPROM 2 from the $V_{DD}$ terminal, the outer terminal B used for writing the data is not necessary. However in this case, it takes many hours to complete the writing of the data in the EPROM 2 of this hybrid integrated circuit device; thus, there is little advantage to this type of EPROM 2.

SUMMARY OF THE INVENTION

In view of the above problem of the related art, an object of the present invention is to provide a hybrid integrated circuit which is capable of having written data written therein without an outer terminal for supplying a writing voltage just after hybrid integrated circuits are disposed on a circuit board.

In order to accomplish the above-described object, according to the present invention, a power supplying circuit is disposed on the circuit board for writing the data in the memory and for reading the data from the memory, a pad is disposed on the circuit board for supplying a first voltage is used for writing the data in the memory to the power supplying circuit before the circuit board is packaged, and an outer terminal is fixed to the circuit board for supplying a second voltage used for reading the data from the memory to the power supplying circuit after the circuit board is packaged.

Therefore, the data can be written in the memory without an outer terminal for supplying the first voltage after hybrid integrated circuits are disposed on the circuit board.

Further, according to the present invention, the power supplying circuit includes preventing means for preventing the supply of voltage to the second power supplying line which is connected to an integrated circuit when a third voltage at the pad is larger than a fourth voltage at the outer terminal.

Therefore, the writing voltage cannot be supplied to the second power supplying line.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PREFERRED EMBODIMENTS

Preferred embodiments of the present invention are described hereinafter with reference to the accompanying drawings.

First Embodiment

Figure 1:
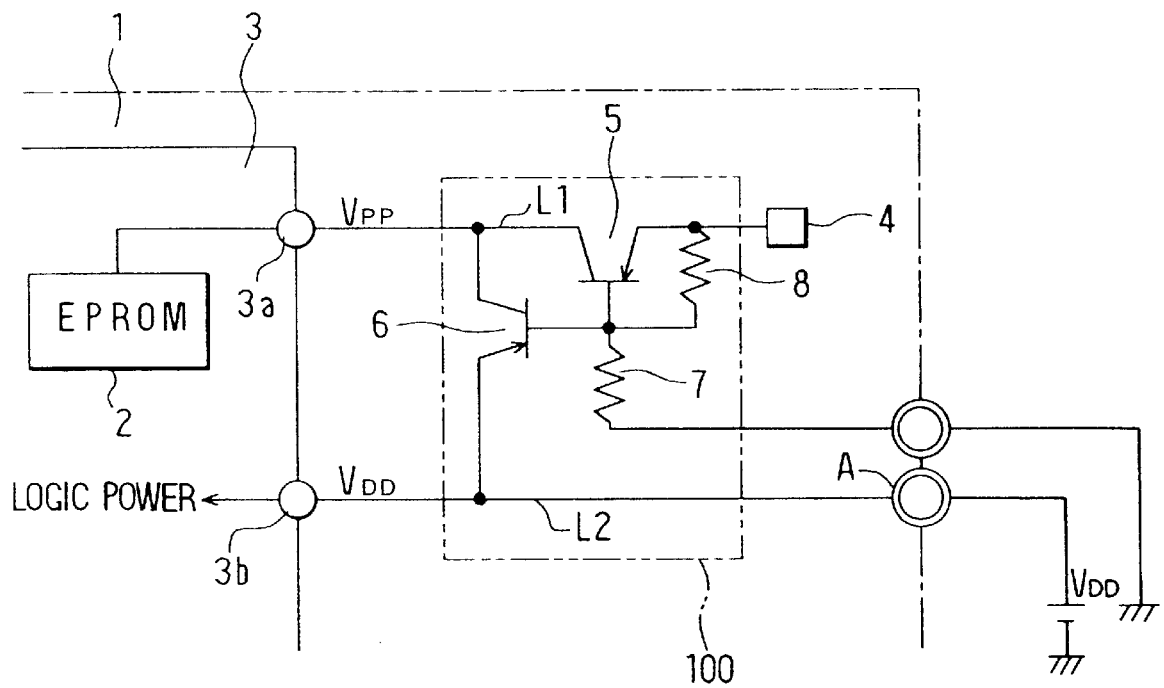
FIG. 1 is a circuit diagram illustrating a part of the hybrid integrated circuit device according to a first preferred embodiment of the present invention.

FIG. 1 shows a circuit diagram illustrating a part of the hybrid integrated circuit device according to a first preferred embodiment of the present invention. An EPROM 2 integrated in an IC 3 is disposed on a circuit board 1. Also, a pad 4 for supplying a high voltage for writing data to the EPROM 2, and a voltage supplying circuit 100 for supplying a voltage $V_{PP}$ and a voltage $V_{DD}$ to power terminals 3a and 3b of the IC 3 are disposed on the circuit board 1. The voltage $V_{PP}$ is used for not only writing data in the EPROM 2 but also reading the data from the EPROM 2. The voltage supplying circuit 100 includes a first pnp transistor 5, a second pnp transistor 6, and resistors 7, 8. The first transistor 5 is disposed on a power supply line L1 extending from the pad 4, which supplies a writing voltage to the EPROM 2 when the high voltage is supplied to pad 4. The second transistor 6 is disposed between the power supply line L1 and a power supply line L2 extending from an outer terminal A, which supplies the voltage $V_{DD}$ (5 V) supplied from the outer terminal A to the IC 3 when the first transistor 5 is off. The resistor 8 prevents the first transistor 5 from acting improperly in response to noise after the circuit board 1 is packaged. The resistors 7, 8 are printed on the circuit board 1 or made from discrete resistors.

Figure 2:
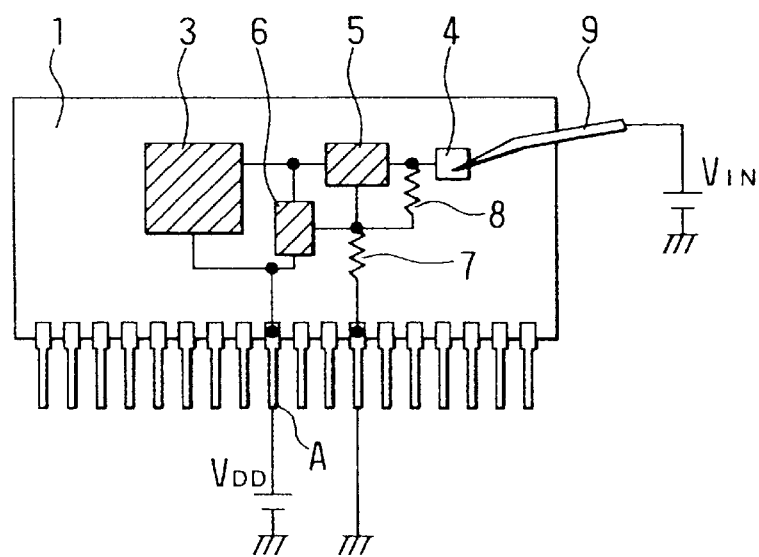
FIG. 2 is a block diagram illustrating a state in which data are being written in an EPROM 2 in the hybrid integrated circuit device illustrated in FIG. 1.

The data are written in the EPROM 2 after all circuits are disposed on the circuit board 1 but before all circuits on the circuit board 1 are packaged (i.e., covered by resin after being inserted in a case). In this case, as shown in FIG. 2, the voltage $V_{DD}$ is supplied to the IC 3 via the outer terminal A, the ground is connected to one terminal of the resistor 7, and the high voltage $V_{IN}$ (about 10–16 V) for writing the data is supplied to the pad 4 with a needle 9 or a spring contact probe.

Figure 3:
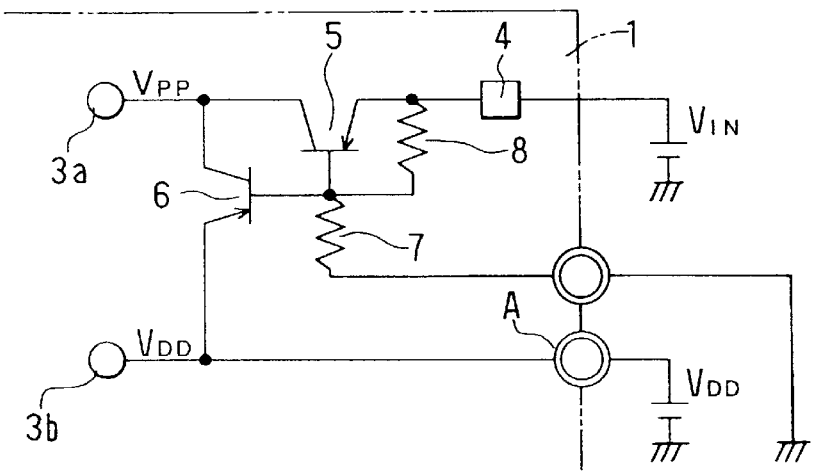
FIG. 3 is a circuit diagram illustrating a state in which data are being written in the EPROM 2 in the hybrid integrated circuit device illustrated in FIG. 1.

FIG. 3 shows a circuit diagram illustrating a state in which data are written in the EPROM 2. When current flows to the resistor 7, the first transistor 5 turns on, and the power terminal 3a of the IC 3 is supplied with a voltage $V_{IN}-V_{CE1(SAT)}$ ($V_{CE1(SAT)}$ is a saturation voltage between the collector and the emitter of the first transistor 5) as the writing voltage $V_{PP}$. A voltage at the base of the first transistor 5 is $V_{IN}-V_{be1}$ ($V_{be1}$ is a voltage between the base and an emitter of the first transistor 5), and is larger than the voltage $V_{DD}$ (5 V), thus the second transistor 6 is still off. Therefore, the power terminal 3b of the IC 3 is supplied with the voltage $V_{DD}$ via the outer terminal A without being raised by the high voltage $V_{IN}$. The IC 3 writes the data in the EPROM 2 upon being supplied with the above-described voltage via the power terminals 3a, 3b.

Figure 4:
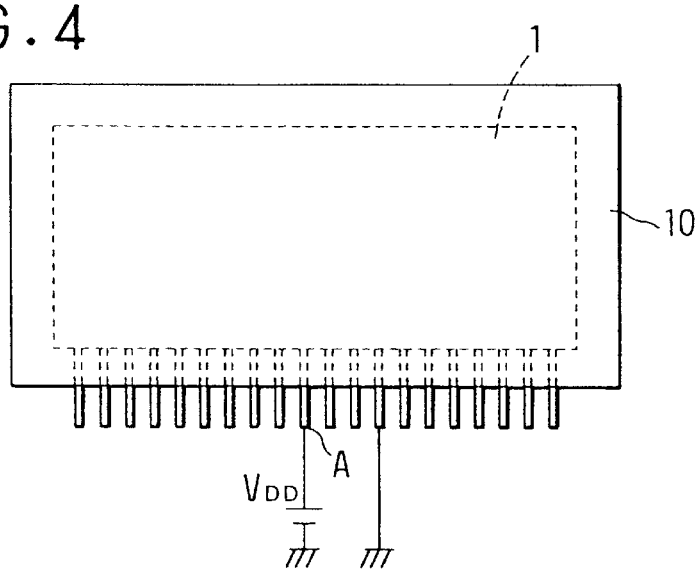
FIG. 4 is a front view illustrating a packaged hybrid integrated circuit device illustrated in FIG. 1.

The data are read from EPROM 2 after the circuit board 1 is packaged. FIG. 4 shows a packaged hybrid integrated circuit device. When the data are read from EPROM 2, the outer terminal A is supplied with the voltage $V_{DD}$, and another outer terminal is grounded.

Figure 5:
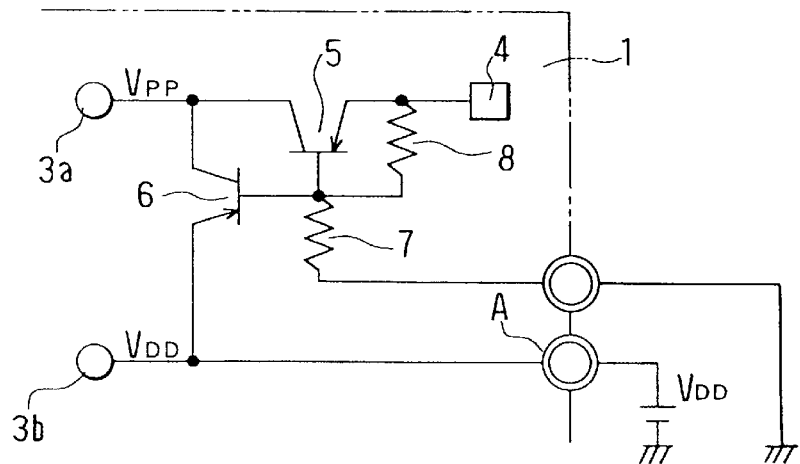
FIG. 5 is a circuit diagram illustrating a state in which data are read from the EPROM 2 in the hybrid integrated circuit device illustrated in FIG. 1.

FIG. 5 shows a circuit diagram illustrating a state in which the data are read from the EPROM 2 in the hybrid integrated circuit device. After packaging, because the pad 4 can not be electrically connected to the needle 9 or the spring contact probe, the first transistor 5 is off. On the other hand, the second transistor 6 is supplied with the voltage $V_{DD}$ via the outer terminal A. Therefore, the power terminal 3a of the IC 3 is supplied with a voltage $V_{IN}-V_{CE2(SAT)}$ ($V_{CE2(SAT)}$ is a saturation voltage between the collector and emitter of the second transistor 6) as the reading voltage $V_{PP}$. The power terminal 3b of the IC 3 is supplied with the voltage $V_{DD}$ via the outer terminal A. The IC 3 reads the data from the EPROM 2 upon being supplied with the above-described voltage via the power terminals 3a, 3b.

According to the this embodiment, after the IC 3 which integrates the EPROM 2 is disposed on the circuit board 1, the data are written in th e EPROM 2 by means of supplying the high voltage $V_{IN}$ to the pad 4. Further, after the circuit board 1 is packaged, the data are read from the EPROM 2 by supplying the voltage $V_{DD}$ to the outer terminal A. Therefore, the outer terminal B for supplying power is not necessary in the this embodiment.

Second Embodiment

Figure 6:
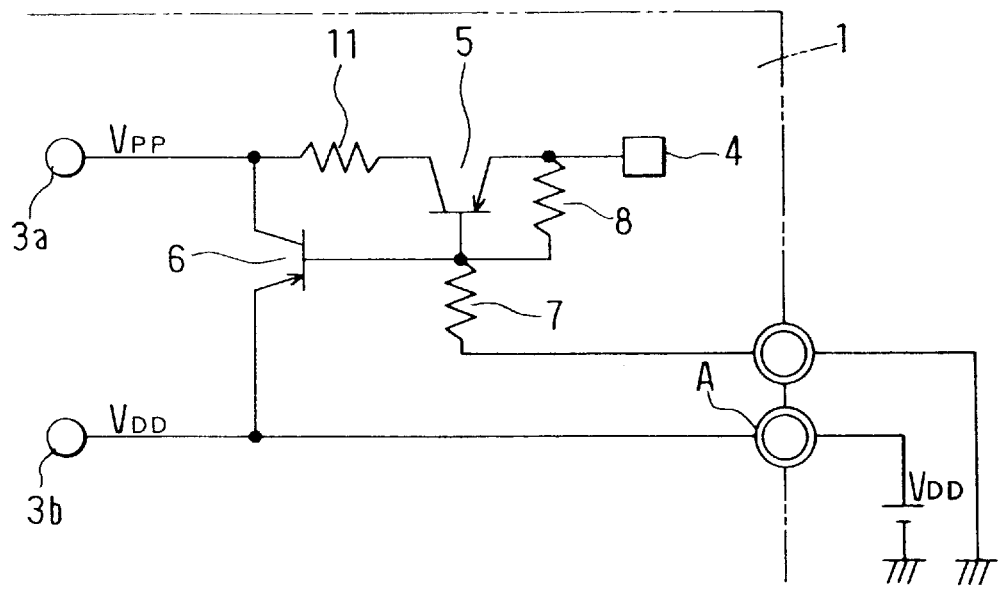
FIG. 6 is a circuit diagram illustrating a part of the hybrid integrated circuit device according to a second preferred embodiment of the present invention.

FIG. 6 shows a circuit diagram illustrating a part of the hybrid integrated circuit device according to a second preferred embodiment of the present invention. As shown in FIG. 6, a resistor 11 is disposed between the collector of the first transistor 5 and the collector of the second transistor 6. Because of a voltage drop across the resistor 11, the emitter-base junction of the second transistor 6 is not forward biased. Therefore, when the data are written in the EPROM 2, current does not flow between the collector and emitter of the second transistor 6, and the writing voltage $V_{PP}$ does not change.

Third Embodiment

Figure 7:
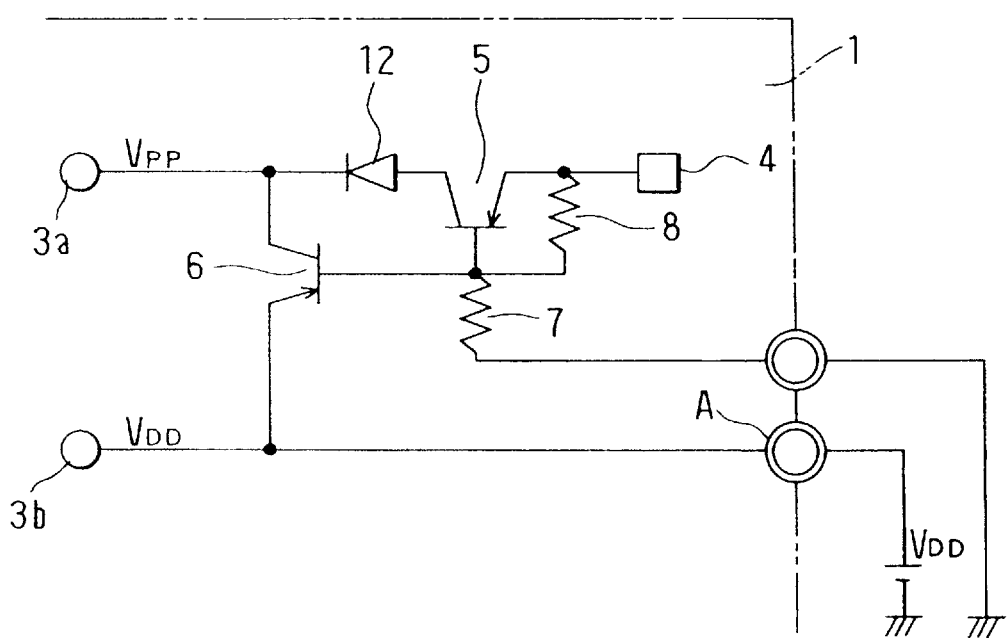
FIG. 7 is a circuit diagram illustrating a part of the hybrid integrated circuit device according to a third preferred embodiment of the present invention.

FIG. 7 shows a circuit diagram illustrating a part of the hybrid integrated circuit device according to a third preferred embodiment of the present invention. As shown in FIG. 7, it is possible to dispose a diode 12 between the collector of the first transistor 5 and the collector of the second transistor 6 instead of the resistor 11 illustrated in FIG. 6.

Fourth Embodiment

Figure 8:
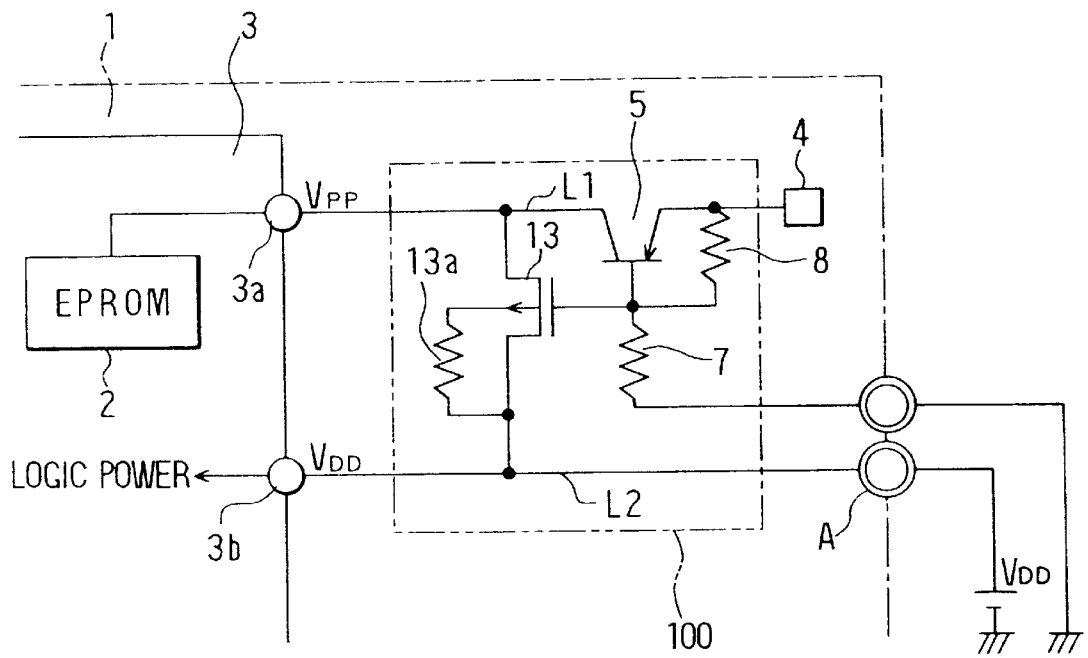
FIG. 8 is a circuit diagram illustrating a part of the hybrid integrated circuit device according to a fourth preferred embodiment of the present invention.

FIG. 8 shows a circuit diagram illustrating a part of the hybrid integrated circuit device according to a fourth preferred embodiment of the present invention. As shown in FIG. 8, a P-channel MOS transistor 13 is disposed between the power supply line L1 and the power supply line L2 instead of the second transistor 6 illustrated in FIG. 5. A resistor 13a is used for setting a bias voltage of the P-channel MOS transistor 13.

Without the resistor 13a, when the pad 4 is supplied with the high voltage $V_{IN}$, the voltage at a drain of the MOS transistor 13 (or at the source of the MOS transistor 13) is $V_{DD}+V_F$ ($V_F$ is a forward bias at the pn junction between the drain of the MOS transistor 13 (or the source of the MOS transistor 13) and a semiconductor substrate which integrates the MOS transistor 13 therein (not shown)) because the pn junction is forward biased, thus, the voltage at the terminal 3a is less than $V_{IN}-V_{CE1(SAT)}$ described in the first preferred embodiment, and the data is not written in the EPROM 2.

However, in this embodiment, because of the resistor 13a, the voltage at the drain of the MOS transistor 13 is $V_{DD}+V_F+R\times I$ (R is the resistance of the resistor 13a, I is a magnitude of current which consecutively flows from the drain of the MOS transistor 13 to the semiconductor substrate and the resistor 13a); therefore, the voltage at the terminal 3a is sufficient for writing the data in the EPROM 2.

Fifth Embodiment

Figure 9:
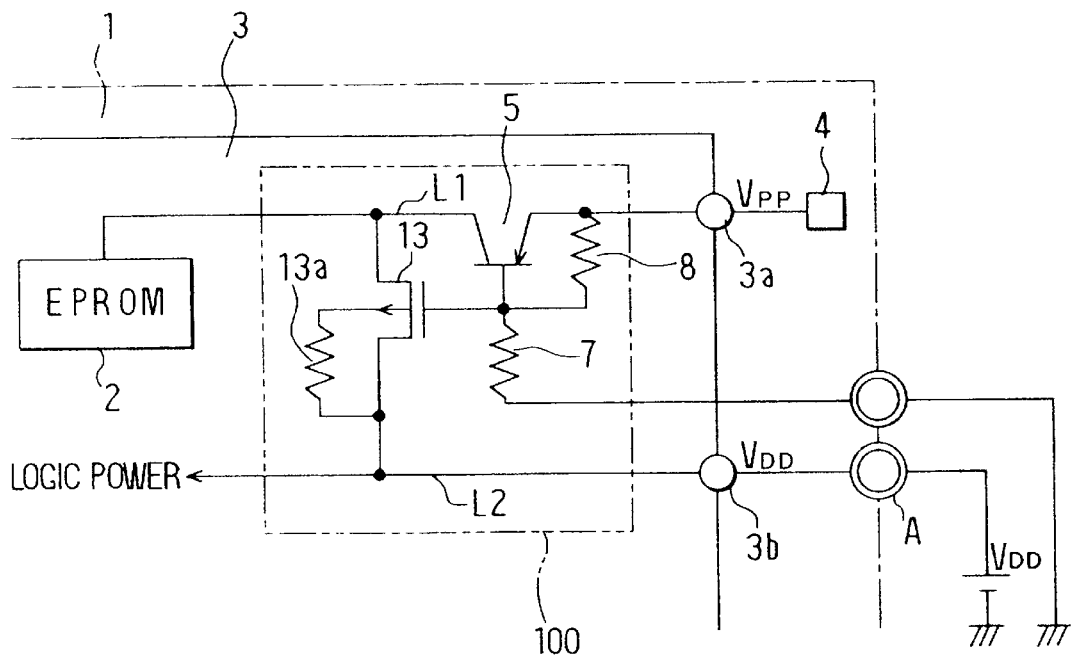
FIG. 9 is a circuit diagram illustrating a part of the hybrid integrated circuit device according to a fifth preferred embodiment of the present invention.
Figure 10:
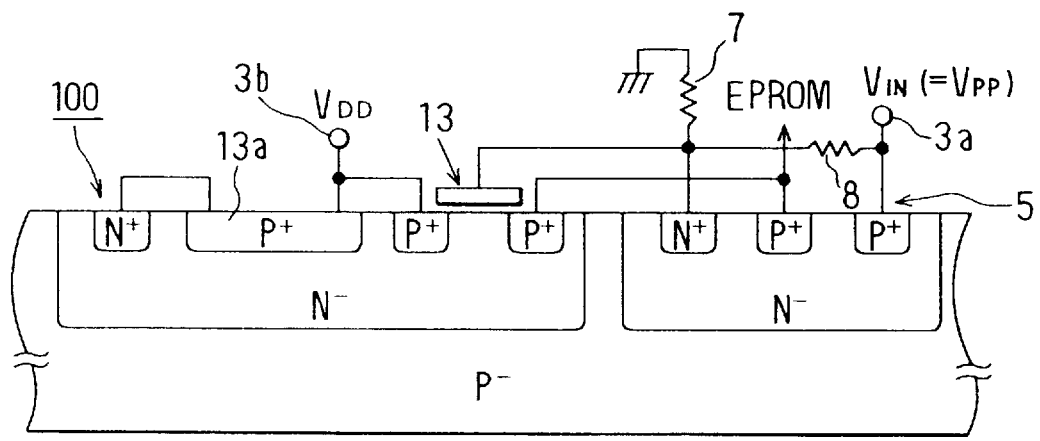
FIG. 10 is a cross-sectional view illustrating an IC 3 illustrated in FIG. 9.
Figure 11:
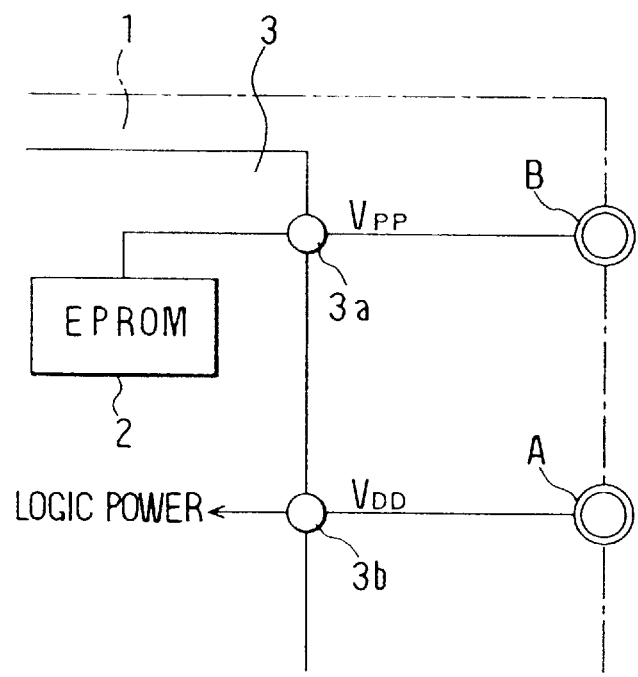
FIG. 11 is a circuit diagram illustrating a part of the conventional hybrid integrated circuit device according to the related art.

FIG. 9 shows a circuit diagram illustrating a part of the hybrid integrated circuit device according to a fifth preferred embodiment of the present invention. As shown in FIG. 9, the first transistor 5, the resistors 7, 8, the P-type channel MOS transistor 13, and resistor 13a are integrated in the IC 3. FIG. 10 is a cross-sectional view illustrating the IC 3 illustrated in FIG. 9.

The present invention may be embodied in other specific forms without departing from the spirit or essential characteristics thereof. For instance, the EPROM 2 may be adopted not only an integrated type as described above embodiments (integrated in the IC 3) but also as discrete type separated from the IC 3.

In the above-described embodiments, while the pad 4 is not supplied with the voltage after the circuit board 1 is packaged, the second transistor 6 becomes on, and the logic power $V_{DD}$ is supplied to the IC 3 via the outer terminal A. However, the writing voltage can be directly supplied to the power terminal 3a of the IC 3 via the pad 4 without using the transistors 5, 6, and after the data are written in the EPROM 2, the writing voltage can be supplied to the EPROM 2 via the outer terminal A by means of disposing a power supplying line between the outer terminal A and the power terminal 3a of the IC 3.

The present embodiments are therefore to be considered in all respects as illustrative and not restrictive, the scope of the invention being indicated by the appended claims rather than by the foregoing description, and all changes which come within the meaning and range of equivalency of the claims are therefore intended be embraced therein.

What is claimed is:

1. A hybrid integrated circuit device comprising:
   a circuit board;
   a memory cell disposed on the circuit board for electrically storing data therein;
   a pad disposed on the circuit board for receiving a first voltage used for writing data in the memory cell before the circuit board is packaged;
   an outer terminal, fixed to the circuit board, for receiving a second voltage used for reading data from the memory cell after the circuit board is packaged; and
   a power supplying circuit disposed on the circuit board for supplying the memory cell with the first voltage from the pad when the pad receives the first voltage and for supplying the memory cell with the second voltage from the outer terminal when the outer terminal receives the second voltage.

2. A hybrid integrated circuit device according to claim 1, further comprising:
   an integrated circuit;
   a first power supplying line connecting the pad and the memory through the power supplying circuit; and
   a second power supplying line connecting the outer terminal and the integrated circuit through the power supplying circuit,
   wherein the power supplying circuit further comprises:
      a first switching element, disposed on the first power supplying line, which is turned on to supply the first voltage to the memory when the pad receives the first voltage, and
      a second switching element, disposed between the first power supplying line and the second power supplying line, for supplying the second voltage to the memory when the second switching element is on.

3. A hybrid integrated circuit device according to claim 1, further comprising an integrated circuit;
   a first power supplying line connecting the pad and the memory through the power supplying circuit; and
   a second power supplying line connecting the outer terminal and the integrated circuit through the power supplying circuit,
   wherein the power supplying circuit includes preventing means for preventing the first voltage from being supplied to the second power supplying line from the first power supplying line when the first voltage at the pad is larger than a fourth voltage at the outer terminal.

4. A hybrid integrated circuit device according to claim 3, wherein the preventing means is a first transistor which is disposed between the first power supplying line and the second power supplying line and maintains its off state when the first voltage at the pad is larger than the voltage applied at the outer terminal.

5. A hybrid integrated circuit device according to claim 4, wherein the first transistor is a pnp-type transistor whose collector is connected to the first power supplying line, whose emitter is connected to the second power supplying line, and whose base is connected to a voltage dividing point which is between a first resistor and a second resistor collectively forming a voltage divider which divides the first voltage at the pad.

6. A hybrid integrated circuit device according to claim 5, wherein the power supplying circuit includes a second transistor, disposed on the first power supplying line, whose collector is connected to the collector of the first transistor, whose emitter is connected to the pad, and whose base is connected to the base of the first transistor.

7. A hybrid integrated circuit device according to claim 5, further comprising a third resistor disposed on the first power supplying line and connected to both the pad and the collector of the first transistor.

8. A hybrid integrated circuit device according to claim 5, further comprising a diode, disposed on the first power supplying line, whose anode is connected to the pad and whose cathode is connected to both the collector of the first transistor.

9. A hybrid integrated circuit device according to claim 4, wherein the first transistor is a P-channel MOS transistor whose drain is connected to the first power supplying line, whose source is connected to the second power supplying line, and whose gate is connected to a voltage dividing point which is between a first resistor and a second resistor which both resistors collectively forming a voltage divider which divides the first voltage at the pad.

10. A hybrid integrated circuit device according to claim 9, further comprising a fourth resistor connected to the source of the P-channel MOS transistor to increase a drain voltage of the P-channel MOS transistor.

11. A hybrid integrated circuit device according to claim 9, wherein the memory cell and the power supplying circuit are integrated in the integrated circuit.

12. A hybrid integrated circuit device according to claim 1, wherein the first voltage is larger than the second voltage.

13. A hybrid integrated circuit device comprising:
   a circuit board;
   a memory cell disposed on the circuit board for electrically storing data therein;
   a integrated circuit disposed on the circuit board for writing data in the memory cell and for reading data from the memory cell;
   a pad disposed on the circuit board for receiving a first voltage used for writing data in the memory cell before the circuit board is packaged;
   an outer terminal fixed to the circuit board for receiving a second voltage which enables the integrated circuit device to operate after the circuit board is packaged; and
   a power supplying circuit disposed on the circuit board for supplying the memory cell with the first voltage from the pad when the pad receives the first voltage while preventing the first voltage from being applied to the integrated circuit and for supplying the memory cell with the second voltage from the outer terminal as a voltage used for reading data from the memory cell when the second voltage is supplied from the outer terminal to the integrated circuit.

14. A hybrid integrated circuit device according to claim 13, further comprising:

a first power supplying line connecting the pad and the memory cell through the power supplying circuit; and a second power supplying line connecting the outer terminal and the integrated circuit through the power supplying circuit, wherein the power supplying circuit further comprises: a first switching element, disposed on the first power supplying line, which is turned on to supply the first voltage to the memory cell when the pad receives the first voltage, and a second switching element disposed between the first power supplying line and the second power supplying line, the second switching element maintaining its off state when the first switching element is turned on and being turned on when the second voltage is supplied to the integrated circuit.

15. A hybrid integrated circuit comprising:

a circuit board;

a memory cell disposed on said circuit board;

a pad disposed on said circuit board which receives a first voltage used for writing data to said memory cell prior to packaging said circuit board;

a terminal fixed to said circuit board which receives a second voltage used for reading data from said memory cell after packaging said circuit board; and a power supplying circuit disposed on said circuit board which supplies said memory cell with the first voltage from said pad and which supplies said memory cell with the second voltage from said terminal, whereby said pad is arranged such that the hybrid integrated circuit does not require an outer terminal for writing data to said memory cell after packaging.

16. The hybrid integrated circuit of claim 15, wherein the memory cell is an EPROM.

* * * * *